United States Patent [19]

Van Brunt et al.

[11] Patent Number: 4,814,713
[45] Date of Patent: Mar. 21, 1989

[54] COAXIAL TEST FIXTURE FOR DETERMINING SHIELDING EFFECTIVENESS OF A DEVICE AGAINST INTERFERING ELECTROMAGNETIC FIELDS

[75] Inventors: Michael K. Van Brunt, Ventura; John S. Miller, Los Angeles, both of Calif.

[73] Assignee: G & H Technology, Inc., Santa Monica, Calif.

[21] Appl. No.: 5,617

[22] Filed: Jan. 21, 1987

[51] Int. Cl.⁴ ............................................. G01R 31/02
[52] U.S. Cl. ..................................... 324/539; 324/555; 324/585 A
[58] Field of Search ................ 324/538, 539, 509, 533, 324/534, 58 B, 58.5 B, 58 A, 58.5 A, 57 R, 555

[56] References Cited

U.S. PATENT DOCUMENTS

| | | | |
|---|---|---|---|
| 2,747,160 | 5/1956 | Bird | 324/58 A |
| 3,839,672 | 10/1974 | Anderson | 324/58 A X |
| 4,281,284 | 7/1981 | Stutz et al. | 324/58 A |
| 4,325,022 | 4/1982 | Pelletier | 324/533 |
| 4,425,542 | 1/1984 | Tsaliovich et al. | 324/58 A X |
| 4,463,309 | 7/1984 | Crochet et al. | 324/57 R |

Primary Examiner—Reinhard J. Eisenzopf
Assistant Examiner—Robert W. Mueller
Attorney, Agent, or Firm—George J. Netter

[57] ABSTRACT

A non-intrusive, annular, broad range current sensor is located about the transmission line at the shorting location of the shielding device. Effectiveness of the shielding of the device can be readily determined for any particular predetermined frequency or range of frequencies by noting the current sensor readings and output voltage. That is, the lower the output voltage/sensor voltage readings in the test frequency range, the higher the shielding effectiveness of the device.

1 Claim, 2 Drawing Sheets

COAXIAL TEST FIXTURE FOR DETERMINING SHIELDING EFFECTIVENESS OF A DEVICE AGAINST INTERFERING ELECTROMAGNETIC FIELDS

The present invention relates generally to testing of the transfer impedance or shielding effectiveness to electric current of a device, and, more particularly, to a coaxial test fixture for applying a measured current signal of predetermined frequency or range of frequencies to the device and measuring induced signal leakage through or past the device.

BACKGROUND OF THE INVENTION

An ever increasing problem is that of pollution of electrical and electronic equipment by external or internal interference electromagnetic fields. For example, shielded cables for electronic equipment are frequently exposed to relatively large electromagnetic fields which induce unwanted signals in the shielded wires that can impair or even destroy the equipment connected to the cable. Accordingly, it desirable to reduce the shield currents and this is most effectively accomplished by grounding the shield at some convenient point prior to cable interconnection with equipment or entering shielded areas.

The grounding structure to which the cable shield is terminated may be a specially constructed housing for the equipment or other convenient means. Exemplary of the latter, on board a ship sensitive electronic equipment will frequently be stored below deck while cabling just as frequently must be located on deck where it is exposed to a variety of relatively large interference field sources (e.g., radar). In this case, termination of a cable shield would be to the ship deck or hull at the point where the cable passes through the deck to enter the ship interior.

A highly satisfactory termination means for this purpose is that disclosed in co-pending U.S. patent application Ser. No. 642,170, CABLE SHIELD GROUNDING APPARATUS, by M. K. Van Brunt, assigned to the same assignee as the present application. The grounding apparatus of this copending patent application is received on the cable with special means clampingly contacting the cable shield and the grounding apparatus is then securely affixed to the ship deck by welding, for example. The grounding apparatus of this patent application is one general class of apparatus and device that can be advantageously tested for shielding effectiveness by use of the fixture to be described.

SUMMARY OF THE DISCLOSURE

In the practice of the present invention, the cable shielding device is mounted within and connected as a short across a transmission line. More particularly, the test fixture includes butted 50-ohm transmission lines to which the shielding device is mounted in terminating relation to the transmission line and a source relation to the output transmission line.

An annular, broad range current sensor such as in the referred Miller et al. application is located about the transmission line at the shorting location of the shielding device. Effectiveness of the shielding of the device can be readily determined for any particular predetermined frequency or range of frequencies by noting the current sensor readings and output voltage. That is, the lower the output voltage/sensor voltage readings in the test frequency range, the higher the shielding effectiveness of the device.

DESCRIPTION OF A PREFERRED EMBODIMENT

Figure 1:
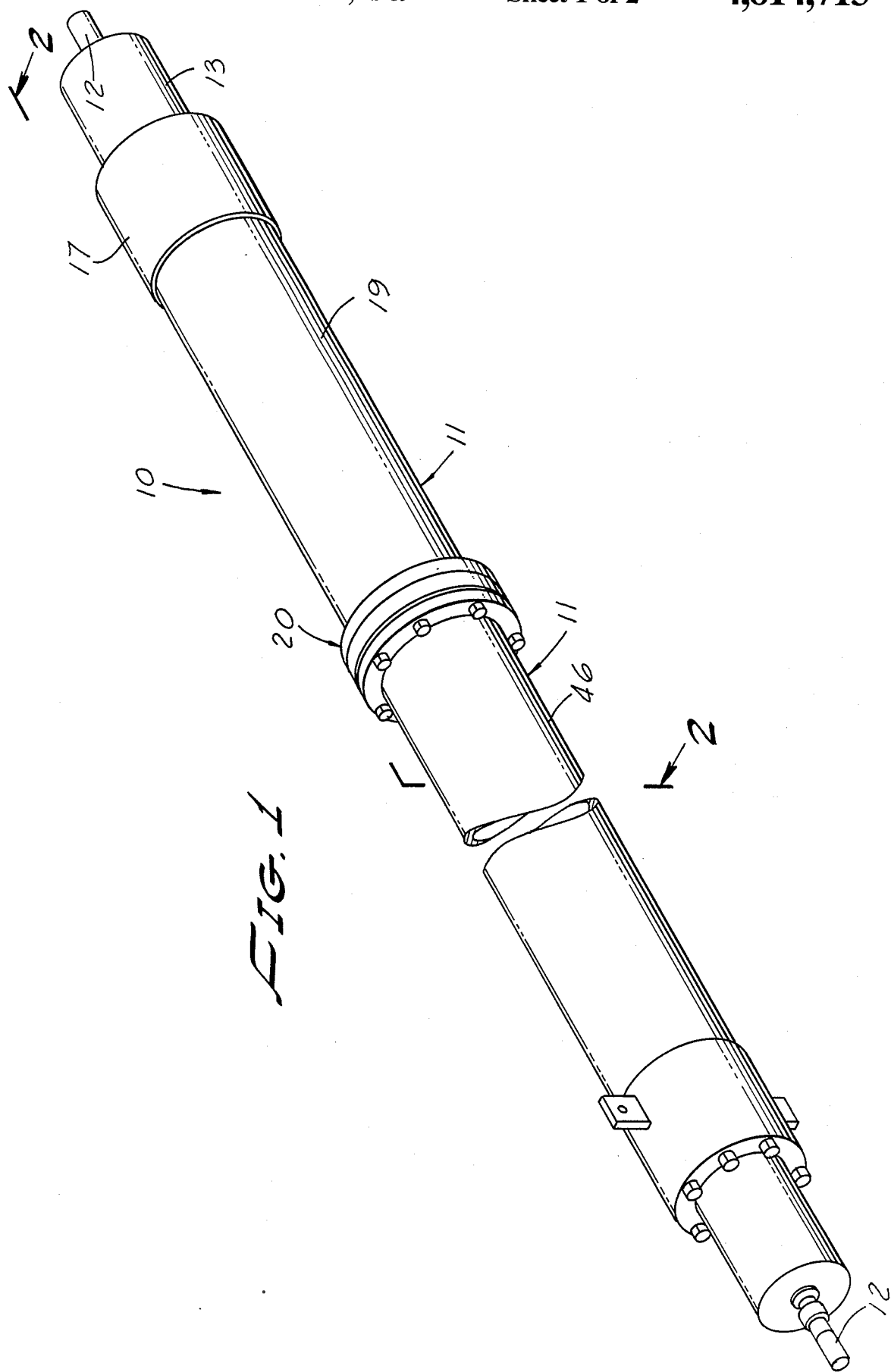
FIG. 1 is a perspective view of the test fixture to be described.

Turning now to the drawing and particularly FIG. 1, the test fixture of this invention is enumerated generally as 10. It is seen to include a generally elongated cylindrical housing 11 within which the device to be tested is mounted in a way that will be described later. A coaxial fitting 12 at one end provides a means for interconnecting via an external load to a supply of test voltage, which voltage is contemplated as ranging from direct current (0 Hz) to as high as 1 gigahertz.

Figure 2:
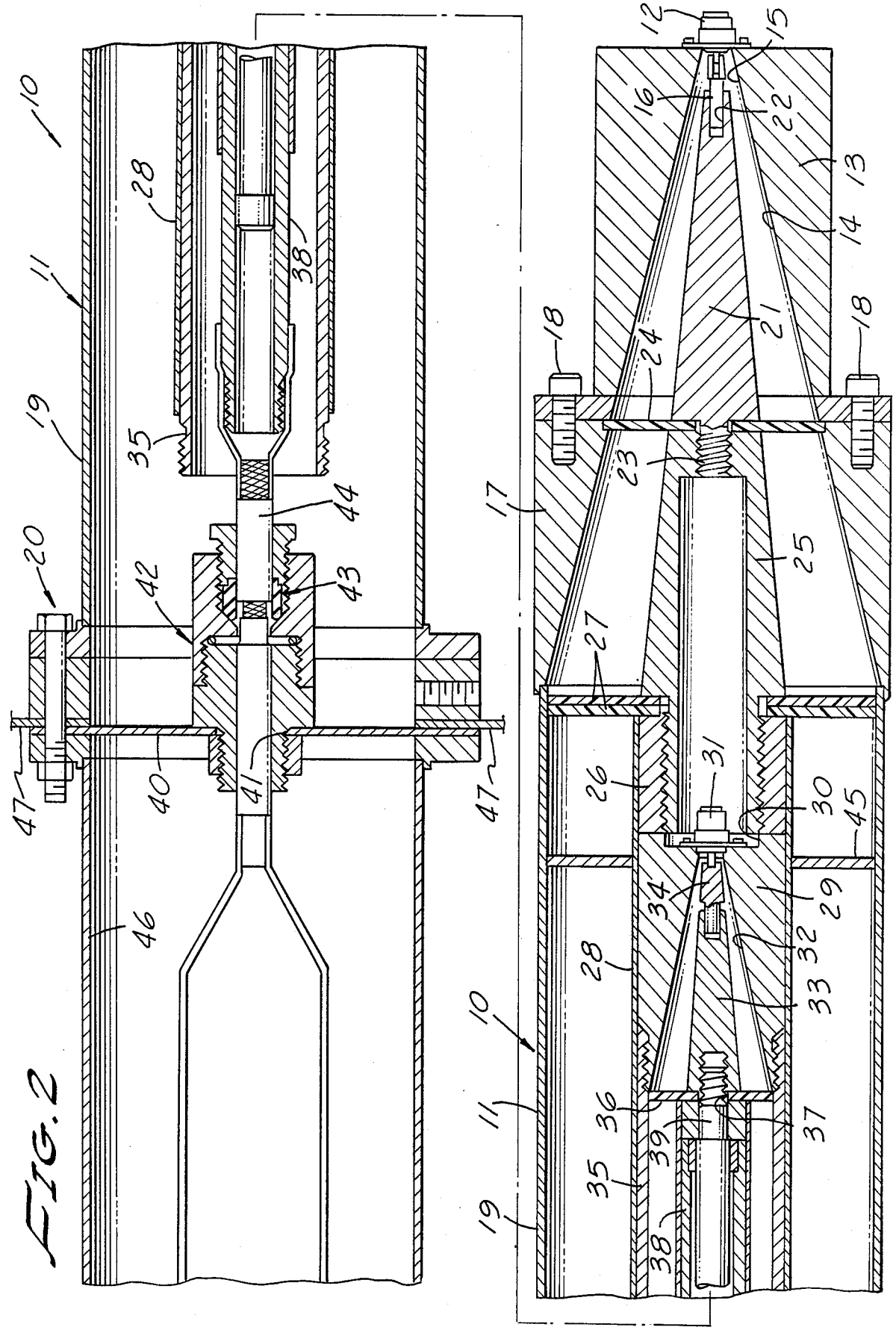
FIG. 2 is a side elevational, sectional view taken along the line 2—2 of FIG. 1.

With reference now to FIG. 2, the test voltage end of the fixture consists of a metal (aluminum) cylinder 13 having a conical cavity 14 opening out from an axial opening 15 in the outer end face. The coaxial connector fitting 12 has its outer shell electrode connected to the cylinder 13 and its central conductor 16 extending into the conical cavity 14. An extender 17 is a metal cylinder to which the cylinder 13 is secured by threaded means 18, for example, and has a conical cavity which continues the conical cavity 14 in a smooth and regular manner.

The test fixture housing is defined by a metal tube 19 which is fitted into the end of the extender 17 and welded thereto. Specifically, the metal tube 19 includes two sections of approximately the same length which are fixedly secured to opposite sides of an annular electrical current sensor 20, such as the broad frequency range sensor described in the co-pending patent application to Miller et al. Maximum capability is achieved by isolating external environments with a shield room wall port 47 located between sensor 20 and a sample plate 40.

An elongated metal cone conductor 21 has its small end slotted at 22 for sliding conductive receipt of the coaxial central conductor 16 therewithin. The larger end of the cone conductor has a threaded axial key 23 which passes through a central opening of a dielectric spacer plate 24. The spacer plate serves to position the cone conductor 21 along the central axis of the tube 19.

An elongated, hollow, conical outer surface extender 25 has a threaded opening in its smaller end for receiving the key 23 of the cone conductor 21. The conical outer surface of extender 25 is coextensive with the conical surface of conductor 21. A uniform diameter end portion 26 is threaded to extender 25 and has a circumferential slot within which one or more dielectric spacers 27 are located to fixedly position the extender along the axis of tube 19.

The elements of the fixture described to this point define a coaxial tapered section which, in a way well known in the electrical arts, produces an adequate dimensional change at higher frequencies.

A metal tube 28 of appropriate inner diameter has one end fitted onto the extender end portion 26 and extends therefrom with its cylindrical axis colinear with the axis of tube 19. This tube 28 serves as a center conductor for the tapered section previously described as well as providing a sliding connection to the output lead of the test sample as shown in FIG. 2.

As will now be described, a further tapered section is provided which is the current input tapered section (FIG. 2). Moreover, in a practical construction of the invention, each of the tapered sections corresponds to a 50 ohm transmission line.

A metal cylinder 29 of suitable outer diameter is slidingly received within a sliding, generally annular short 45. An axial opening 30 in the cylinder end wall has a coaxial connector 31 mounted thereto with its outer electrode connector to the cylinder and the central electrode extending within the cylinder conical cavity 32. A conically shaped core 33 has a slotted end which can be slidingly received on an electrode 34 connected to the central conductor of coaxial connector 31. The opposite end of core 33 has a threaded axial opening for interconnective use to be described.

A further relatively good conducting metal tube 35 preferably made of brass, for example, has an outer diameter enabling sliding receipt within the tube 28. The inner end of the tube 35 is closed off by a dielectric plate 36 having an opening 37 at its center. A brass pipe 38 of outer diameter closely approximating that of the core 33 large end has an internally nested threaded axial rod 39 extending from one end thereof which passes through opening 37 in the dielectric plate 36 and is received within an end opening of core 33. A ring of the brass tube soldered to rod 39 carries a brass shim stock wrap to maintain the center conductor outer diameter as the rod moves axially. This allows testing samples having a non-critical center conductor length.

A shorting plate 40 extends across the entire width of the fixture outer housing flanged tube 19 just beyond the ends of tubes 35 and 38. The plate is conductively connected to the tube 19 and includes a central opening 41. Moreover, the plate includes suitable means identified generally as 42 by which a termination means 43 may be physically and conductively mounted to the plate.

The sliding short has physical supports to prevent tipping and is, in use, positioned near the open end of 35 to minimize cavity length and thereby maximize test frequency capability. Tubes 19 and 46 are separated by test plate 40, shield wall 47 and coaxial current sensor 20.

The ensuing description of the test fixture operation will be given in connection with testing the effectiveness of a cable shield termination means enumerated generally at 43, which is a device serving to ground (terminate) the cable shield at the device. An excellent cable shield termination means of this kind is described in the referenced co-pending application Ser. No. 642,170. Specifically, the means 43 has been mounted onto a cable 44 which passes through the shorting plate opening 41 and terminates or grounds the cable shield to the shorting plate. The cable shield extending through the shorting plate is affixed onto the end of metal tube 38. A test current of predetermined frequency, or range of frequencies, is then applied to the fixture via the coaxial connector fitting 31. If the termination means 43 100 percent effective in grounding the cable shield to test plate 40, then only noise level voltage would be detected at 12. If the termination means is less effective a corresponding leakage voltage is detected by an output voltage sensor on that part of the cable shield that is located on the shielded side of the shorting plate 40, which is to the left as shown in FIG. 2. That is, the larger the leakage voltage detected, the less effective the device being tested, assuming that the input current has not increased.

In the practice of the present invention method and apparatus for testing the transfer impedance or shielding effectiveness of a device in which all current measurements are taken non-intrusively eliminating the need for relatively difficult interconnections. The described apparatus also has no, or substantially no, internal loading which would tend to restrict both input current and output voltage. Specifically, the lack of apparatus input load allows relatively unlimited input current, provided that the test sample or device and the current sensor can handle the current.

Although the test fixture of this invention has been described in connection with the effectiveness testing of a cable shield (e.g., braid termination means, it is believed that the test fixture may be advantageously employed in the testing of a great variety of apparatus utilized for shielding against electromagnetic fields.

What is claimed is:

1. A test fixture for measuring the effectivity of a device for terminating a cable shield, comprising:
    an annular electric current sensing means;
    first and second metal tubes respectively affixed to opposite sides of the sensing means;
    a first electrical transmission line mounted within the first metal tube including tapered section means and having a coaxial connector for interconnection with an external electric current source;
    a metal plate having a single central opening mounted within the first tube between an end of the first transmission line and the annular current sensing means, said plate being continuously conductively secured to the first tube in a closed path about the tube longitudinal axis;
    a second transmission line located within the second tube; and
    means on the metal plate for conductively securing the device to the metal plate during testing while the cable shield interconnects the first and second transmission lines.

* * * * *